United States Patent [19]
Hunter

[11] 3,757,139
[45] Sept. 4, 1973

[54] SOLID STATE SWITCHER FOR RADIO BROADCAST PROGRAMMING

[75] Inventor: E. Bruce Hunter, Mill Valley, Calif.
[73] Assignee: Golden West Broadcasters, Los Angeles, Calif.

[22] Filed: Apr. 9, 1971
[21] Appl. No.: 132,728

[52] U.S. Cl. .................. 307/251, 307/242, 307/243, 307/254, 307/304
[51] Int. Cl. .................. H03k 17/00
[58] Field of Search .................. 307/242, 243, 251, 307/254, 304

[56] References Cited

UNITED STATES PATENTS

| | | | |
|---|---|---|---|
| 3,662,113 | 5/1972 | Von Recklinghausen | 307/251 X |
| 3,665,320 | 5/1972 | Ohsawa et al. | 307/251 X |
| 3,509,374 | 4/1970 | Lockshaw | 307/251 X |
| 3,510,567 | 5/1970 | Fisher | 307/304 X |
| 2,770,728 | 11/1956 | Herzog | 307/304 X |
| 3,219,931 | 11/1965 | Lennon et al. | 307/242 X |
| 3,005,937 | 10/1961 | Wallmark et al. | 307/251 X |
| 3,371,290 | 2/1968 | Kibler | 307/304 X |
| 3,495,097 | 2/1970 | Abramson et al. | 307/304 X |
| 3,509,374 | 4/1970 | Lockshaw | 307/251 X |
| 3,538,349 | 11/1970 | Smith | 307/304 X |

*Primary Examiner*—Stanley D. Miller, Jr.
*Attorney*—Leblanc & Shur

[57] ABSTRACT

Disclosed is a solid state switcher particularly adapted for switching audio inputs to a common output in radio broadcasting programming. The switcher is comprised of a plurality of novel JFET switching gates which are connected in a control matrix to selectively connect the selected input to the common output in accordance with a solid state logic selection circuit. Also provided are pushbutton selectors and an illuminated display for indicating which input is connected to the output.

6 Claims, 6 Drawing Figures

INVENTOR
E. BRUCE HUNTER

BY Le Blanc and Shur

ATTORNEYS.

INVENTOR
E. BRUCE HUNTER

BY Le Blanc and Shur
ATTORNEYS.

INVENTOR
E. BRUCE HUNTER

BY Le Blanc and Shur

ATTORNEYS.

SOLID STATE SWITCHER FOR RADIO BROADCAST PROGRAMMING

This invention relates to a solid state switching circuit and more particularly to a simplified and less expensive system for switching one or more audio outputs between a plurality of audio inputs. An important feature of the system is the incorporation of a large number of relatively simple and inexpensive junction field effect transistor solid state switches or switching gates.

Modern radio broadcasting techniques call for a comprehensive switching network capable of continuously and rapidly changing program requirements. For example, news requirements are variable and unpredictable and suddenly conceived program ideas must be quickly accommodated into the system. There is a need for a system which is inexpensive and yet sufficiently flexible to keep up with the demands and ideas of talent and program management.

The present invention is directed to an inexpensive and yet flexible switching device particularly suited for use in switching audio circuits. The switcher includes as an important component a plurality of novel solid state switching gates, each gate being comprised of at least one junction field effect transistor (JFET). It provides instant clickless switching, bringing one of a large number of available audio sources into a given attenuator by fingertip control. There is great ease and rapidity of switching which, in the preferred embodiment, involves depressing only one letter and one number. The audio comes in solidly and positively. Once the contact is made, it will stay that way and there is nothing mechanical to vibrate or become loose. Likewise, the gate breaks contact quickly and with no clock, and stays off until further actuated.

While previous switching systems employing JFET's have been proposed, they have involved relatively complex circuitry rendering them uneconomical for large-scale switching applications, such as radio program distribution. In addition, the previously proposed systems have not been suited for switching the relatively high level audio signals as produced by a recording tape or the like.

In the present invention, a plurality of audio inputs are selectively connected to a common output through the use of solid state digital logic circuits. By depressing a pair of pushbuttons, one preferably bearing a number and the other a letter, decimal signals pass through a pair of decimal-to-binary converters to a pair of storage devices. The appropriate signals from the storage devices are reconverted to decimal representation and passed to a pair of lamp and gate drivers. These drivers energize suitable lights or lamps giving an indication of the buttons which have been depressed and therefore indicating which audio signal source is coupled to the output.

At the same time, the lamp and gate drivers provide output signals through a matrix to the selected one of a plurality of JFET gates. The matrix signal is applied through a large resistance to the gate electrode of the selected gate, preferably forward biasing the gate P-N junction and switching the JFET on. The audio signal is applied through a resistance divider network to the JFET source or drain electrode where the audio input signal is transmitted through the source-drain circuit of the "on" JFET to a load and/or the switcher output terminals. In addition to its simplified and inexpensive construction, an important feature of the switcher of this invention is that it may be used with either balanced or unbalanced audio input signals.

It is therefore one object of the present invention to provide an improved switcher particularly adapted for use in switching audio input signals.

Another object of the present invention is to provide a solid state switcher having increased simplicity, small size, and low cost.

Another object of the present invention is to provide an improved switching gate incorporating a junction field effect transistor.

Another object of the present invention is to provide an improved JFET switching gate useful both in unbalanced and balanced configurations.

Another object of the present invention is to provide a solid state switcher incorporating digital logic circuitry and pushbutton control for selectively connecting a plurality of inputs to one or more common output circuits.

Another object of the present invention is to provide a switching gate having superior isolation between DC currents and audio.

Another object of the present invention is to provide an improved switcher in which audio input circuit assignments can be changed rapidly and easily at one central point and in which the switcher provides instant selection of multiple inputs which are only limited by the size of the switcher matrix.

Another object of the present invention is to provide an improved switcher susceptible to modular solid state construction which permits the rapid substitution of defective units with no time lost in troubleshooting.

Another object of the present invention is to provide extreme reliability, even under adverse environmental conditions where other systems have proven inadequate.

These and further objects and advantages of the invention will be more apparent upon reference to the following specification, claims, and appended drawings, wherein:

Figure 1:
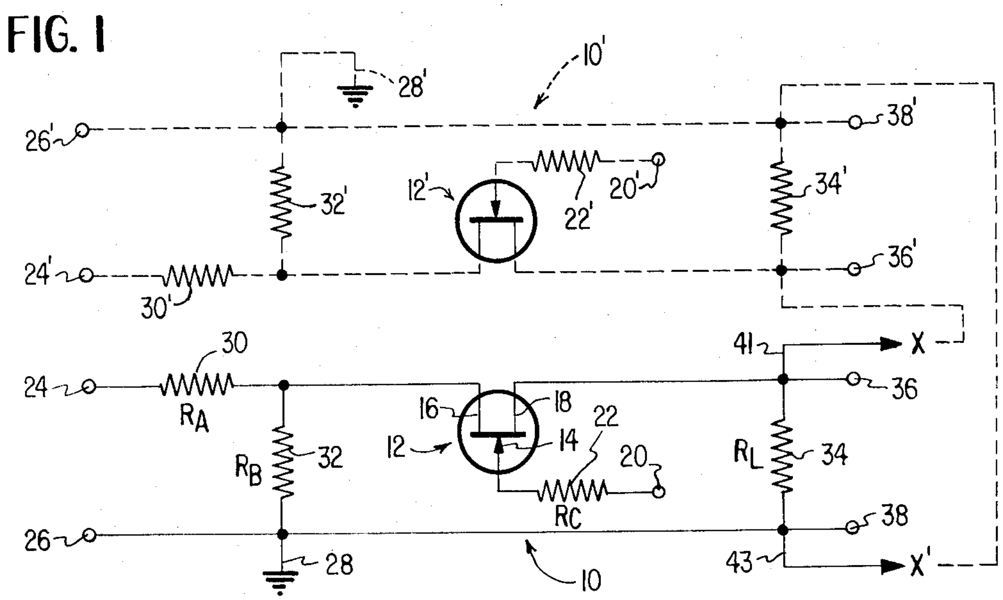
FIG. 1 is a circuit diagram of a novel JFET switching gate used in the switcher of the present invention.

Referring to the drawings, a switching gate constructed in accordance with the present invention is generally indicated at 10 in FIG. 1. This gate comprises a junction field effect transistor (JFET) 12 having a gate electrode 14, a source electrode 16, and a drain 18. The gate 14 of JFET 12 is connected to a bias or control terminal 20 through a relatively large resistor 22, labeled $R_C$. JFET 12 may be either of the P-channel type or the N-channel type and, by way of example only, may be of the type identified as 2N5163 or 2N4360. In the preferred embodiment, the JFET 12 is of the type available in plastic packaging.

Transistor 12 is connected to a pair of audio input terminals 24 and 26, the latter in the unbalance configuration illustrated in FIG. 1 preferably being grounded as indicated at 28. By way of example only, input terminals 24 and 26 may be connected to an audio tape source or the like upon which has been placed information suitable for broadcast by standard radio equipment. The tape source connected to audio input terminals 24 and 26 may typically contain news information, advertising, music, combinations or one or more of these, or other conventional broadcast information. The input terminals are connected through a resistance divider comprising resistor 30, labeled $R_A$, and resistor 32, labeled $R_B$, to the source electrode 16 of transistor 12. Connected between drain electrode 18 and ground is a load resistor or attenuator 34, labeled $R_L$. The audio output is supplied to the radio broadcasting equipment over output terminals 36 and 38

In the switcher of the present invention, switching gate 10 comprises only one of many identical gates for connecting different audio inputs to the output terminals 36 and 38. A similar switching gate 10', in all respects identical to gate 10, is illustrated in phantom lines in FIG. 1 and is connected across load resistor 34 by leads 41 and 43, labeled X and X', respectively. Switching gate 10' is provided to connect a different audio source at its input terminals 24' and 26' to the output terminals 36 and 38. It is understood that in the preferred embodiment many additional gates, all identical to gate 10, are connected to leads 41 and 43 so that their inputs may be selectively coupled to the common output terminals 36 and 38. The additional gates have been omitted in the unbalanced configuration illustrated in FIG. 1 for the sake of clarity.

Figure 2:
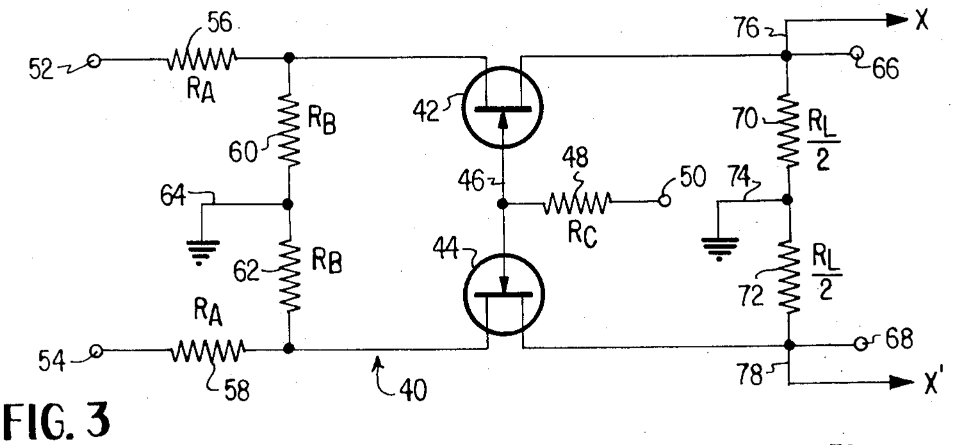
FIG. 2 is a circuit diagram of the JFET switching gate connected in a balanced configuration.

FIG. 2 is a circuit diagram of a switching gate 40 connected in a balanced configuration. This gate comprises a pair of JFET's 42 and 44, in all respects identical to transistor 12 of FIG. 1. Transistors 42 and 44 have their gate electrodes connected together by a lead 46 and are connected in common through a resistor 48, again labeled $R_C$, to the bias or control terminal 50. It is understood that resistor 48 corresponds in all respects to the gate electrode resistor 22 in FIG. 1.

The audio input signal in FIG. 2 is supplied to input terminals 52 and 54 through a resistance divider comprising series resistors 56 and 58, each corresponding to resistor 30 in FIG. 1, and through shunt resistors 60 and 62, each corresponding to the resistor 32 of FIG. 1. The junction of resistors 60 and 62 is grounded in FIG. 2 as at 64.

The output signal in FIG. 2 is derived across output terminals 66 and 68 connected across a pair of load resistors 70 and 72, each having a value approximately equal to half the resistance of resistor 34 in FIG. 1. The junction of resistors 70 and 72 is grounded at 74.

As with the previous embodiment, in the balanced configuration of FIG. 2, additional switching gates, in all respects identical to gate 40, are connected to the output terminals 66 and 68 by leads 76 and 78, again labeled X and X'. In this way, a plurality of different audio input signals may be selectively connected to the common output terminals 66 and 68, but the additional gates connected to leads 76 and 78 have been omitted in FIG. 2 for the sake of clarity.

Figure 3:
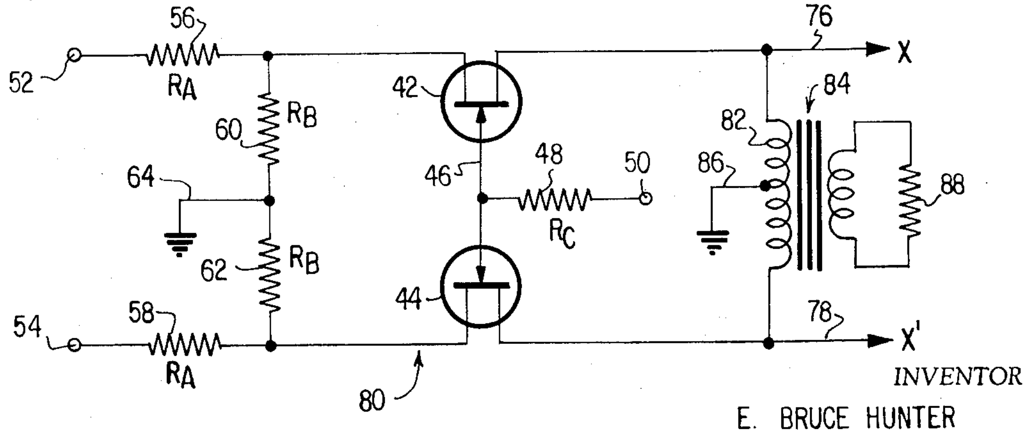
FIG. 3 is a circuit diagram showing a balanced JFET gate connection with a transformer output.

FIG. 3 shows a further modified embodiment illustrating a balanced switching gate 80 with a transformer output. In FIG. 3, like parts bear like reference numerals and many of the components bearing similar numbers are identical to the components in the embodiment of FIG. 2, previously described. In FIG. 3, the drain electrodes of transistors 42 and 44 are connected to the primary winding 82 of an audio transformer, generally indicated at 84. Primary winding 82 is center tapped as at 86 and connected to ground. Primary winding 82 is coupled through transformer 84 to a secondary winding 86, in turn connected to a load as indicated by the load resistor 88. As with the embodiment of FIG. 2, in FIG. 3 only a single switching gate 80 is illustrated, it being understood that additional identical gates are connected to the leads 76 and 78 so that additional audio input signals can be selectively coupled through the gates to the load impedance 88.

Following are typical circuit values for the JFET switching gates in the embodiments of FIGS. 1-3. By way of example only, all resistors, labeled $R_B$, may be equal to the resistance of load resistor $R_L$. Resistors $R_A$ may typically have a resistance ten times the resistance of resistor $R_B$. This provides a bridging input of 10 K ohms.

In the off condition, there is an equivalent transfer capacitance across the JFET's which acts in conjunction with the output load as a voltage divider. These leakage signals (currents) will increase at a rate of 6 db per octave. However, in the configurations shown, isolation exceeds 60 db at 20 KHz. The input resistance network acts as an initial insertion loss of 20 db. The JFET switch itself in the on condition creates a loss of approximately 3 db. In the off condition, the switch loss varies inversely with frequency and is typically 60 db at 20 KHz, increasing to approximately 80 db at 1,000 KHz. The JFET's source-drain resistance is in the order of $10^{11}$ ohms. Increase of the resistance when reverse biased (turned off) is due to the carriers being removed from the channel and drawn toward the gate-channel junction. The insertion loss of the JFET in the on condition is due to the finite resistance of the device. It is minimized in the present invention by forward biasing the gate-channel P-N junction and is typically less than 100 ohms. Typical gate bias or control potential values for a P-channel JFET are an "on" potential of −10 volts and an "off" potential of +20 volts, whereas for an N-channel JFET, a typical on potential is +10 volts and a typical off potential is −20 volts at the gate of the JFET.

In biasing the P-N junction, it is important to minimize the DC currents flowing in the audio channel. This is to reduce transients in switching and simplifies the audio circuit. To turn the gate on, it is necessary to remove the reverse bias and preferably to forward bias the JFET's. Some means of current limiting is necessary under forward bias conditions. The present invention provides a simple and inexpensive arrangement for producing this by feeding the gate elements through a high resistor $R_C$, typically having a value on the order of 20 megohms. This large resistor, together with the effective gate-channel capacitance, results in an RC circuit having turn-on and turn-off times in the millisecond range which is satisfactory for audio switching. Transients are also reduced by this effect.

The junction field effect transistor is an imperfect switch and has certain problems. The first of these is crash-through. In order to keep a JFET turned off, the reverse bias must exceed the sum of the peak input signal amplitude, plus the JFET pinched-off voltage.

Should the peak value of the input signal exceed this amount, the signal peaks that so exceed will crash through the gates producing a distorted signal composed of the excessive peaks of the input waveform. It would appear that increasing the reverse bias could prevent this condition. However, a limit is soon reached based on the gate channel breakdown voltage (BVgs) of the JFET. This has in the past prevented simplified JFET circuits from being used in high level audio switches.

The present invention provides a simple solution to this problem by the incorporation of the voltage divider which reduces the input signal voltage to manageable values. It also gives crash-through protection from high common mode signals.

A second problem with JFET's is that of the on resistance being modulated by the input signal. This produces even harmonic distribution with waveform asymmetrical. It is caused by the gate being coupled capacitively to the source and/or the drain. The magnitude of modulation is a function of (a) the amplitude and frequency of the input signal and (b) the external impedance connection to the gate terminal. It would seem that a large capacitor connected to the gate terminal would minimize this effect, but actually, to switch, it would have to be discharged through the channel and would cause transients. In the present invention, a large gate resistor is provided and this serves to reduce this distortion to a negligible amount.

Figures 4, 6:
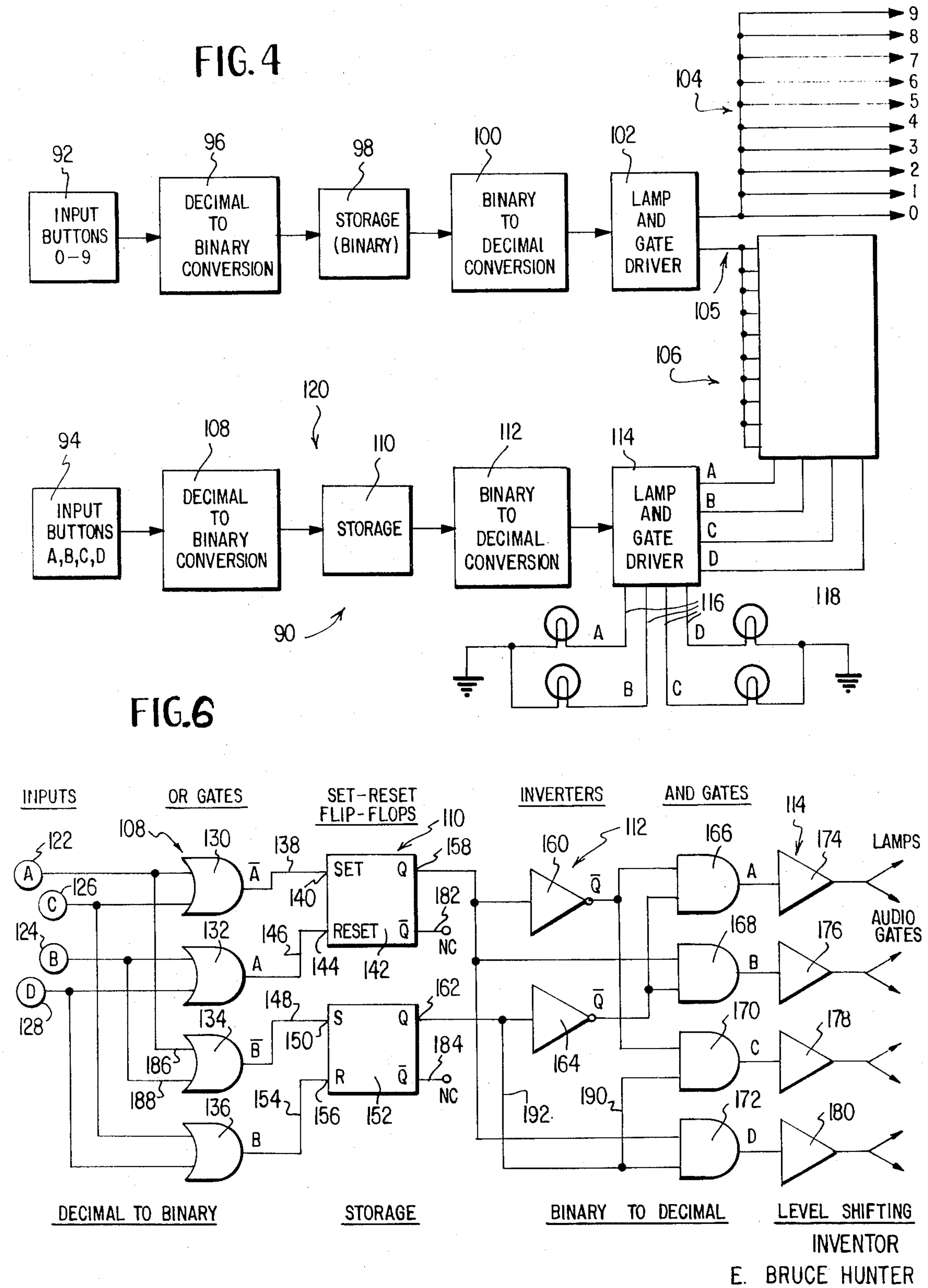
FIG. 4 is a simplified block diagram of a solid state switcher usable with any of the switching gates of FIGS. 1–3.
FIG. 6 is a detailed block diagram of a portion of the switcher of FIG. 4.

FIG. 4 is a block diagram of a solid state switcher usable with any of the gates of the embodiments of FIGS. 1-3. The switcher is generally indicated at 90 in FIG. 4 and comprises two sets of pushbuttons 92 and 94. Buttons 92 are preferably ten in number and labeled 0 through 9, whereas pushbuttons 94 are four in number, labeled A through D. By pushing two buttons, there is a possibility of selecting one of forty different inputs to which the output may be connected. A signal from one of the buttons 92 in FIG. 4 is supplied through a decimal-to-binary converter 96 to a binary storage device 98, binary-to-decimal converter 100, and finally to lamp and gate driver 102. Lamp and gate driver 102 has a first series of ten outputs, 104, for connecting to corresponding lamps, and a second series of ten outputs, connected to a control matrix generally indicated at 106. The control matrix 106 is connected to a corresponding set of gates constructed in accordance with the embodiments of any of FIGS. 1–3.

The second set of lettered buttons 94 are similarly connected through a decimal-to-binary converter 108 through a binary storage circuit 110, a binary-to-decimal converter 112, and to lamp and gate driver 114. Driver 114 has a first set of four outputs connected to suitable lamps, as illustrated at 116, and a second set of outputs 118 connected to the control matrix 106.

In operation of the switcher of FIG. 4, when one of the input buttons 92, labeled 0 through 9, is depressed, a suitable signal is sent through the converter 96 to storage 98, which produces an output converter in converter 100 causing lamp and gate driver 102 to energize one of the lamp leads 104 and a corresponding one of the matrix output leads 105. As the result, an appropriate one of the lamps is lit to indicate which one of the pushbuttons 92 was depressed. Similarly, when one of the buttons 94 is depressed, a signal passes through the converters and storage 110, causing driver 114 to produce an output on a corresponding one of the lamp output leads 116 and a corresponding one of the control matrix output leads 118. The lamp energized is again indicative of which one of the pushbuttons 94 was depressed. While the lamps may be suitable incandescent lamps, in the preferred embodiment the lamps take the form of solid state light-emitting diodes. For this purpose, two small windows are placed over the selector buttons 92 and 94, each window containing a matrix of tiny dots. These dots are solid state light-emitting diodes or lamps and come on in the configuration of the numeral selected. Once installed, this system has a particularly long life since there are no filaments to burn out.

In FIG. 4, the switcher is illustrated as making possible a connection to the output through the matrix 106 of any one of forty possible inputs as represented by the ten numbered buttons 92 and the four lettered buttons 94. It is understood that because of the simplicity and small size of the switching gates illustrated in FIGS. 1–3, the number of connections provided economically and in a small space is practically unlimited. That is, the JFET gate control terminals, such as terminals 20 and 50, may be arranged to form an N-dimension matrix. Selection of a single gate can be accomplished with N selecting signals, each of which can assume a number of conditions equal to the $N^{th}$ root of the number of the input sources. For instance, with 1,000 audio input sources and using a three-dimensional matrix for the matrix 106, it is possible to make three pushbutton selections, each of which could assume the cube root of 1,000 or 10 possible conditions.

Figure 5:
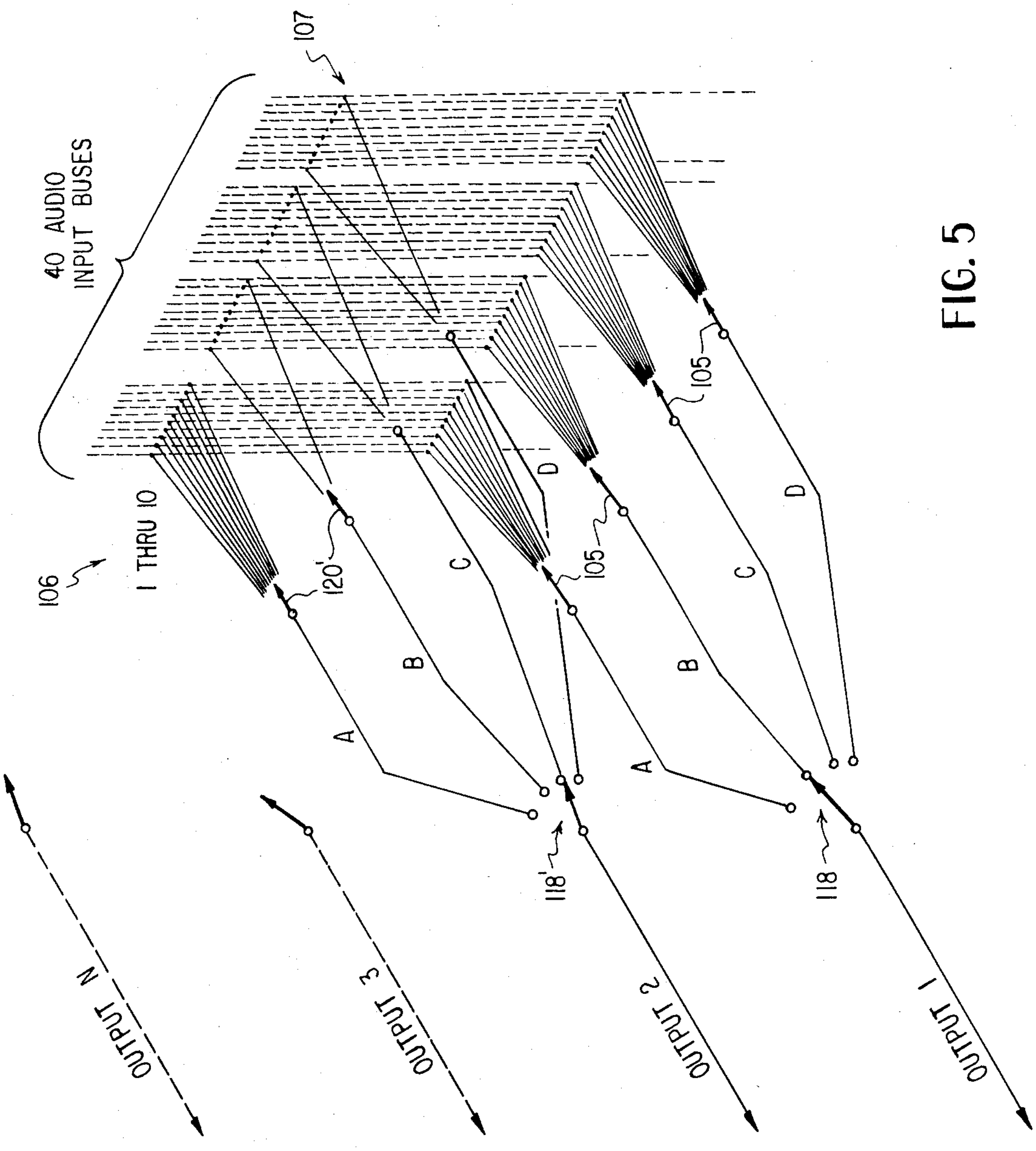
FIG. 5 is a simplified view of a switching matrix usable with the circuit of FIG. 4.

FIG. 5 shows the matrix 106 constructed so that any one of forty audio input buses 107 may be connected to an output. The matrix forms a four-position switch indicated diagrammatically at 118 and energized by one of the output leads 118 and a ten-positioned gauged four stage switch energized by one of the output leads 105 in FIG. 4. Additional outputs 2 through N may be similarly connected to the audio buses by corresponding solid state networks 118′ and 120′ formed by the switching gates of FIGS. 1–3.

FIG. 6 is a detailed block diagram showing the solid state logic for the switcher of FIG. 4. Only the channel for the lettered input buttons 94 is illustrated in FIG. 6 for the sake of clarity, it being understood that the channel for the numbered buttons 92 is of similar construction but with a corresponding increased number of elements corresponding to the increased number of buttons 92. Referring to FIG. 6, channel 120 of the switcher comprises input terminals 122, 124, 126, and 128, labeled A, B, C, and D respectively. These terminals are energized when a corresponding one of the input buttons 94 of FIG. 4 is depressed. That is, when button A is depressed in FIG. 4, a potential is applied to input terminal 122, when button B is depressed a potential is applied to input terminal 124 in FIG. 6, and so on. In FIG. 6, the decimal-to-binary converter 108 takes the form of a plurality of OR gates such as gates 130, 132, 134, and 136. An output signal is applied by lead 138 from OR gate 130 to the set input terminal 140 of a set-reset flip-flop 142 forming a part of the storage unit 110. A complementary signal is supplied from the OR gate 132 to the reset terminal 144 of flip-flop 142 by way of lead 146. Lead 148 connects the output of OR gate 134 to the set terminal 150 of set-reset flip-flop 152 and lead 154 connects the output of OR gate 136 to the reset terminal 156 of flip-flop 152. The Q output terminal 158 of flip-flop 142 is connected to the input of an inverter 160 and the Q output 162 of flip-flop 152 is similarly connected to an inverter 164. The outputs of the inverters 160 and 164 are coupled to various ones of a plurality of AND gates 166, 168, 170, and 172, forming the binary-to-decimal converter 112. Finally, the AND gates are connected through level shifting amplifiers 174, 176, 178, and 180, which form the lamp and gate driver 114 of FIG. 4. Amplifier 174 supplies an output signal for the A line of the lamp outputs 116 in FIG. 4 and for the A line of the gate outputs 118 in FIG. 4. Similarly, amplifier 176 produces a B line output for the lamp set 116 and the matrix set 118. The output from level shifting amplifier 178 produces the C line output at 116 and the C line output at 118 in FIG. 4 and similarly level shifting amplifier 180 produces the D line output 116 and the D line output at 118 in FIG. 4.

In operation and referring to FIG. 6, when the A button is depressed, terminal 122 in FIG. 6 is connected to a potential which passes through OR gate 130 and is applied by lead 138 to the set terminal 140 of flip-flop 142. This results in an output Q from the flip-flop on lead 158 which is applied to inverter 160. The $\overline{Q}$ output of flip-flop 142 is not connected as illustrated at 182 and similarly the $\overline{Q}$ output of flip-flop 152 is not connected as illustrated at 184. The inverted output from inverter 160 is applied to one input of AND gate 166. Terminal 122 is also connected by a lead 186 which passes a signal through OR gate 134 to the set input 150 of flip-flop 152. This results in a Q output on lead 162 which passes through inverter 164 having its output connected to the other input of AND gate 166. Since a $\overline{Q}$ signal appears at both inputs to the AND gate 166, an output signal is passed by this AND gate through level shifting amplifier 174 to energize the lamp lead A and the matrix lead A.

When the B button is depressed, terminal 124 is energized and a signal is passed through OR gate 132 to the reset terminal 144 of flip-flop 142. This results in a complementary output on lead 158, i.e., a $\overline{Q}$ output, which is applied to one input of AND gate 168. Terminal 124 is connected by a lead 188 through OR gate 134 so that a signal is applied to the set terminal 150 of flip-flop 152. The Q output of lead 166 is inverted through inverter 164 to apply a $\overline{Q}$ signal at its output to the other input terminal of AND gate 168. With a $\overline{Q}$ signal at both inputs, AND gate 168 conducts and produces a B signal for the lamps and matrix at the output of level shifting amplifier 176. When terminal 126 is energized, i.e., the C button is depressed, a signal through OR gate 130 energizes the Q output at lead 158 from flip-flop 142, which passes through inverter 160 to produce a $\overline{Q}$ signal at the upper input of AND gate 170. At the same time, the potential at terminal 126 passes through OR gate 136 to the reset terminal of flip-flop 152, producing a $\overline{Q}$ output on lead 140 which is applied by way of a lead 190 to the other input terminal of AND gate 170. Again, $\overline{Q}$ inputs at both terminals and the AND gate causes level shifting amplifier 178 to be energized to produce the C outputs for the lamps and matrix. Finally, depression of button D energizes terminal 128 which passes a signal through OR gate 132 to the reset terminal 144 of flip-flop 142. A resulting $\overline{Q}$ output on lead 158 is applied to the upper input terminal of AND gate 172. A potential at terminal 128 is also applied through gate 136 to the reset terminal 156 of flip-flop 152. The resulting $\overline{Q}$ output on lead 162 is applied by way of a lead 192 to the other input of AND gate 112. With $\overline{Q}$ signals at both inputs, the AND gate 172 conducts, and level shifting amplifier 180 produces a D output for the lamps and matrix.

It is apparent from the above that the present invention provides an improved solid state switcher and particularly one that is of simplified and economical construction and which has a great flexibility for rapidly and reliably connecting selective audio inputs to an audio output. While not so limited, the switcher of the present invention is particularly adapted for radio programming where it is desirable to rapidly switch the output from one input to another. The simplified and inexpensive construction makes possible a large-scale matrix system capable of handling as many as a thousand inputs with ease. Important features of the present invention, in addition to the overall switcher, include the provision of an improved JFET switching gate which eliminates the previous problems accompanying prior JFET switch constructions and particularly eliminates excessive crash-through and on resistance modulation. That is, in previous constructions a problem arises when the gate circuit is used in broadcast or commercial audio systems. In order to keep the gate turned off, the reverse bias must exceed the peak value of the applied input signal plus the pinch-off voltage of the field effect transistor. However, the maximum reverse bias is limited by the gate channel breakdown voltage and typical breakdown voltage is about 20 volts DC. With 20 volts of bias and assuming a 1 volt pinch-off voltage for the field effect transistor employed, the peak value of the maximum input signal would be about 19 volts. Many audio sources and notably tape recorders being rewound can supply several times this voltage. This problem is overcome in the present invention in a simplified and inexpensive manner so that the device is particularly suited for use with such audio sources.

The resistance divider network in the switching gate reduces the input voltage by a factor (typically 10) to increase the range of tolerable input signals. In addition, it provides a DC return for the bias circuit and reduces the effect the DC inputs have on the bias network. It makes possible a circuit which will operate in either a balanced or unbalanced configuration and any loss occasioned by the voltage divider may be compensated by an amplifier in the common output channel. The cost and space requirements provided by this construction are relatively small.

The resistor drive circuit for driving the gate of the field effect transistor may typically have a value of 10 or 20 megohms and limits the junction current under forward bias conditions. This makes it possible to apply a small forward bias which further reduces the field effect transistor channel on resistance and therefore the insertion loss. It limits the reverse bias current should a transistor break down, thus localizing the area of failure by not disabling the bias source. In a balanced circuit, the switching gate construction permits the gates of the two devices to be connected together, which has particular advantage in that the two field effect transistors can be constructed on the same chip where the substrate often forms the gate and is common to both transistors. The large gate resistance also serves to reduce switching transients. This resistance combines with the input capacitance of the field effect transistor to form a resistance/capacitance integrating network which reduces the rate of rise of the control. This stretches the turn-on and turn-off times to the millisecond range and reduces the transient energy in the audio range while still providing acceptable switching performance.

Thus, the present invention, in a simplified and economical way, makes possible a practical and economical transistor switching matrix for use in radio and television stations and in public address installations. While particularly adapted for audio switching in radio and television applications, it is apparent that the switching gate and switcher of the present invention finds use wherever a large number of inputs are desired to be economically and rapidly switched and, for example, may be incorporated in consumer products, such as electronic organs and hi-fi stereo equipment.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A balanced solid state switch for audio frequency signal switching comprising first and second junction field effect transistors each having gate, source and drain electrodes, first and second audio signal input terminals defining a single audio channel, a first resistance divider comprising a first series resistor and a first shunt resistor coupling said first input terminal to one of said source and drain electrodes of said first transistor, a first output impedance coupled to the other of said source and drain electrodes of said first transistor, a second resistance divider comprising a second series resistor and a second shunt resistor coupling said second input terminal to one of said source and drain electrodes of said second transistor, a second output impedance coupled to the other of said source and drain electrodes of said second transistor, all of said first resistors and said first impedance being equal in value to the corresponding ones of said second resistors and said second impedance to provide a balanced single channel circuit, a control terminal whereby said transistors are switched on and off by the application of forward and reverse bias potentials to said control terminal, and a control resistor directly connecting said control terminal to said transistor gates.

2. A switch according to claim 1 wherein said control resistor has a value on the order of 20 megohms.

3. A switch according to claim 2 wherein said series resistors have a resistance value approximately ten times the resistance of said shunt resistors.

4. A switch according to claim 3 wherein said output impedances are resistors having a resistance value approximately equal to one half that of said shunt resistors.

5. A switch according to claim 3 wherein said output impedances comprise a balanced inductor.

6. A switch according to claim 5 wherein said inductor comprises the primary of an audio transformer.

* * * * *

PO-1050 (5/69)

UNITED STATES PATENT OFFICE
CERTIFICATE OF CORRECTION

Patent No. 3,757,139 Dated September 4, 1973

Inventor(s) E. Bruce Hunter

It is certified that error appears in the above-identified patent and that said Letters Patent are hereby corrected as shown below:

In Column 4, line 45, "on" should read --"on"--;
line 46, "off" should read --"off"--.

In Column 5, line 60, "output converter" should read --output converted--.

Signed and sealed this 5th day of February 1974.

(SEAL)
Attest:

EDWARD M.FLETCHER,JR.
Attesting Officer

RENE D. TEGTMEYER
Acting Commissioner of Patents